United States Patent
Xu et al.

(10) Patent No.: US 7,248,111 B1
(45) Date of Patent: Jul. 24, 2007

(54) MULTI-MODE DIGITAL BIAS CONTROL FOR ENHANCING POWER AMPLIFIER EFFICIENCY

(75) Inventors: Sheldon Xu, Edison, NJ (US); Thomas William Arell, Basking Ridge, NJ (US); Mahendra Singh, Bridgewater, NJ (US); Mohammed Ali Khatibzadeh, Hampton, NJ (US)

(73) Assignee: Anadigics, Inc, Warren, NJ (US)

( * ) Notice: Subject to any disclaimer, the term of this patent is extended or adjusted under 35 U.S.C. 154(b) by 124 days.

(21) Appl. No.: 11/106,254

(22) Filed: Apr. 14, 2005

(51) Int. Cl.
*H03G 5/16* (2006.01)
(52) U.S. Cl. .................. 330/133; 330/285; 330/296; 330/310
(58) Field of Classification Search .................. None
See application file for complete search history.

(56) References Cited

U.S. PATENT DOCUMENTS 5,432,473 A * 7/1995 Mattila et al. .............. 330/133
7,116,173 B2 * 10/2006 Tsutsui et al. .............. 330/285
2003/0020545 A1 1/2003 Joly

* cited by examiner

*Primary Examiner*—Khanh Van Nguyen
(74) *Attorney, Agent, or Firm*—William L. Botjer

(57) ABSTRACT

A power amplifier with a multi-mode digital bias control circuit is provided. The power amplifier utilizes a complementary reference voltage generation circuit and a bias current-control circuit to generate a plurality of bias current levels for different output power levels. In an embodiment of the present invention, the power amplifier circuit is connected to a reference voltage and two control signals. Depending on the desired output power level, the control signals set the corresponding bias current in the amplifying transistors, to ensure sufficient linearity. The power amplifier is capable of operating at a very low quiescent current level, for example, 5 mA. As a result, a significant improvement in the power amplifier's overall efficiency is achieved, and the battery talk time of a wireless communication device is increased. The invention finds application in wireless communication devices such as CDMA, WCDMA, EDGE and WLAN mobile devices.

14 Claims, 8 Drawing Sheets

| Logic Voltage | High Power Mode | | Low Power Mode | | PA Shutdown |
|---|---|---|---|---|---|
| | 28dBm | 25bBm | 16dBm | 0dBm | |
| Vref | High | High | High | High | Low |
| Vmode1 | Low | Low | High | High | Low |
| Vmode2 | Low | High | Low | High | Low |

MULTI-MODE DIGITAL BIAS CONTROL FOR ENHANCING POWER AMPLIFIER EFFICIENCY

BACKGROUND

The present invention relates generally to the bias control circuitry of multi-mode power amplifiers. More specifically, the present invention relates to a bias control technique that significantly improves the efficiency of a low-power mode in a multi-mode power amplifier.

Many wireless communication devices use Radio Frequency (RF) power amplifiers to ensure that RF signals attain sufficient strength to reach a base station. Since a power amplifier is one of the major power consuming components inside a wireless communication device, it is important to minimize its power consumption, and therefore, maximize battery time. A power amplifier usually transmits at various power levels, depending on the distance between the wireless communication device and the base station. The lesser the distance, the less power is required.

A typical power amplifier comprises a few bias circuits, one or two driver stages, an output stage, and a few matching circuits. The bias circuit determines the bias current for each amplifying stage. The driving stages ensure that the power amplifier achieves adequate amplification to achieve sufficient signal strength. The output stage generates the required power; and the impedance-matching circuits are used at the input and output of the power amplifier, to match input and output impedances.

In the operation of a linear power amplifier, sufficient bias current is required to achieve linearity at a given output power level. A linear power amplifier, designed for high-power operation, needs a relatively higher bias current than a linear power amplifier that is designed for medium- or low-power operation. As a result, a high-power linear power amplifier with a fixed bias current is inefficient when it is used at the medium- or low-power level. In general, the power-probability density function of a CDMA power amplifier peaks around 0 dBm during urban as well as suburban operations, i.e., most of the time, the CDMA power amplifier transmits close to 0 dBm power. A CDMA power amplifier, designed for high-power operation with a fixed bias current, will be inefficient at 0 dBm.

Various power amplifiers, which provide high and low quiescent currents for different output power levels, have been developed for high-frequency operations. One such power amplifier is described in US Patent Application Number 20040000954A1, titled 'Power Amplifier Having a Bias Current Control Circuit', assigned to Kim, Ji Hoon, et al. The bias circuit elaborated in this patent is capable of adjusting itself continuously, depending on the output power level. Since the power amplifier has two amplifying stages connected in the form of a cascade, both amplifying stages have to be enabled during high- and low-power operations. As a result, this configuration puts a low limit on bias current adjustment.

Another power amplifier is described in US Patent Application Number 20040056711A1, titled 'Efficient Power Control of a Power Amplifier by Periphery Switching', assigned to TriQuint Semiconductor, Inc. This power amplifier divides the output amplifying stage into two sections, with each section having its own separate bias circuit. Both output sections are enabled during high-power operation, whereas only one output section is enabled for low-power operation. Less bias current is required during the low-power mode; therefore efficiency at this mode is improved. The first amplifying stage and the second amplifying stage are always in a cascade configuration in high- and low-power operations. Further, the bias current is reduced only at the output stage and there is no bias current reduction in the first amplifying stage.

Yet another power amplifier is described in US Patent Application Number 20030016082A1, titled 'High Frequency Power Amplifier Circuit Device', assigned to Matsunaga, Yoshikuni et al. This power amplifier provides bias current control at each amplifying stage. Since all the amplifying stages are in a cascade configuration, it is not possible to disable the bias of any individual stage. As a result, the reduction in bias current is limited.

Another bias control circuit is described in U.S. Pat. No. 6,744,321, titled 'Bias Control Circuit for Power Amplifier', assigned to Information and Communications University Educational Foundation Republic of Korea. This bias circuit provides a two-level bias current control for a power amplifier, i.e., a high bias current for the high-power mode and a low bias current for the low-power mode.

In light of the above-mentioned facts, it is desirable to have power amplifiers with multiple bias current levels for different output power levels. Further, in order to enhance overall efficiency, it is desirable to have an optimized low bias current for power amplifiers operating at very low power levels such as 0 dBm or less.

SUMMARY

An object of the present invention is to enable the generation of a plurality of bias-current levels in a power amplifier.

Another object of the present invention is to improve the overall efficiency of the power amplifier by significantly reducing the quiescent current.

Yet another object of the present invention is to increase the life of a battery that is utilized in a wireless communication device.

The objects mentioned above are achieved through exemplary embodiments of the present invention. A power amplifier is provided, in accordance with the present invention, which is capable of generating a plurality of bias-current levels, depending on the power amplifier's transmission power level. A first two-stage amplifier forms the high power channel; a second parallel single-stage amplifier and an RF switch form the low power channel. A complementary reference voltage generator generates a pair of reference voltages, i.e. high and low, to the bias circuits of the high-power channel and the low-power channel. The first control signal $V_{mode1}$ switches reference voltage on or off for either the high-power channel or the low-power channel. When the reference voltage of the high-power channel is high, its bias circuits are turned on and it is enabled, and the power amplifier is operated in the high-power mode. At the same time, the reference voltage of the low-power channel is low, its bias circuit is turned off and the low power channel is disabled. When the reference voltage of the low-power channel is high, its bias circuit is turned on and it is enabled, and the power amplifier is operated in the low-power mode. At the same time, the high-power channel is disabled. The second control signal $V_{mode2}$ provides an additional bias current control for either the high-power mode or the low-power mode. In the low power mode, this additional bias current control allows the power amplifier to switch to a very low bias current for 0 dBm or less transmitted power.

The present invention provides additional low bias current levels, compared with conventional two-mode power amplifiers. A typical quiescent current of 5 mA may be achieved at the low-power mode with 0 dBm or less transmitted power. This current level is about three to four times less than the number achieved by conventional two-mode power amplifiers. Consequently, the present invention significantly improves the overall efficiency of the power amplifier and extends the talk time or the life of a battery in wireless communication devices.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which:

FIG. 9 is a logic table illustrating the logic levels of various control signals in different output power levels, in accordance with an exemplary embodiment of the present invention;

DESCRIPTION OF PREFERRED EMBODIMENTS

The present invention provides a system that enhances the efficiency of a power amplifier. This is achieved by reducing the quiescent current of the power amplifier. The invention finds application in wireless communication devices such as CDMA, WCDMA, EDGE, and WLAN mobile terminals.

Figure 1:
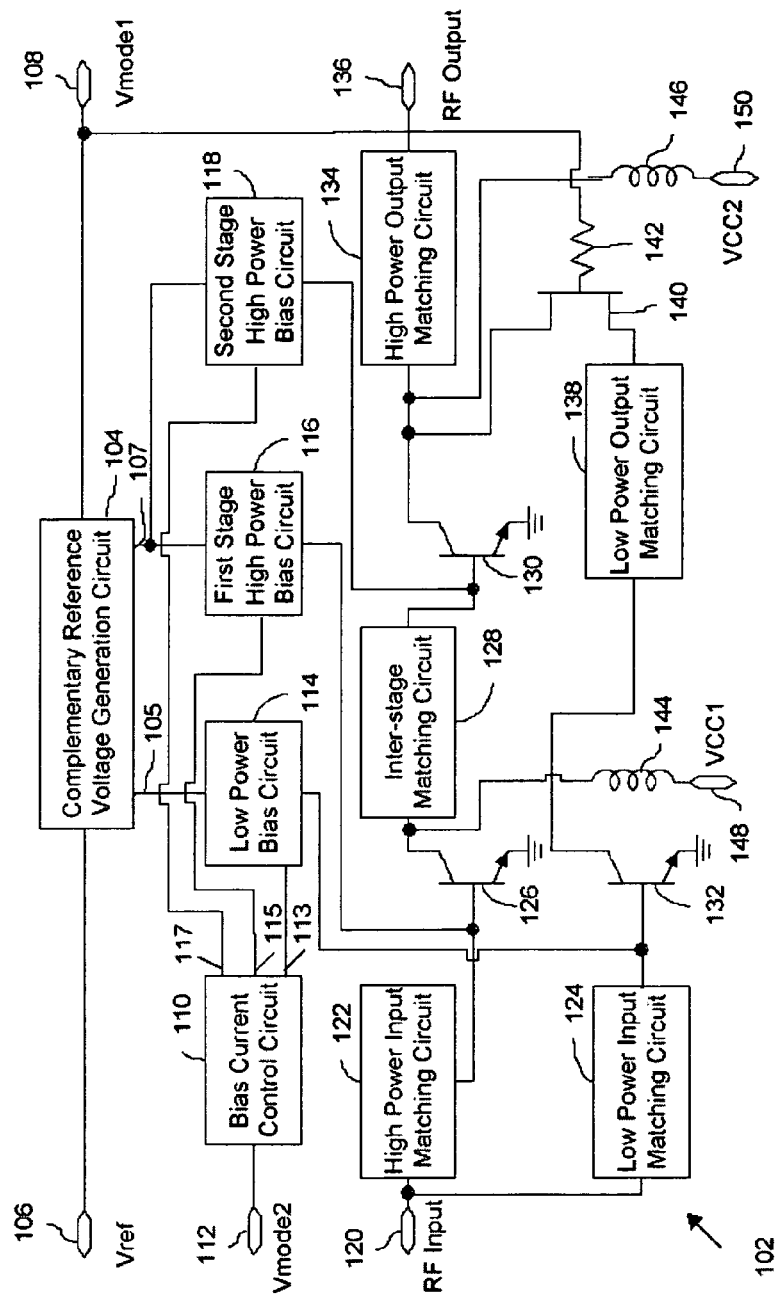
FIG. 1 is a block diagram illustrating a power amplifier and its bias control circuit, in accordance with an exemplary embodiment of the present invention.

FIG. 1 is a block diagram illustrating a power amplifier and its bias control circuit, in accordance with an exemplary embodiment of the present invention. Power Amplifier 102 comprises a Complementary Reference Voltage Generation Circuit 104, a Bias Current Control Circuit 110, a Low Power Bias Circuit 114, a First Stage High Power Bias Circuit 116, a Second Stage High Power Bias Circuit 118, a High Power Input Impedance Matching Circuit 122, a Low Power Input Impedance Matching Circuit 124, a first amplifying transistor 126, an Inter-stage Impedance Matching Circuit 128, a second amplifying transistor 130, a third amplifying transistor 132, a High Power Output Impedance Matching Circuit 134, a Low Power Output Impedance Matching Circuit 138, a depletion mode Field Effect Transistor 140, a resistor 142, a first RF choke 144, and a second RF choke 146. Power Amplifier 102 is connected to a first input voltage 106, hereinafter referred to as $V_{ref}$ 106; a second input voltage 148, hereinafter referred to as $V_{cc1}$ 148; a third input voltage 150, hereinafter referred to as $V_{cc2}$ 150; a first control signal 108, hereinafter referred to as $V_{mode1}$ 108; and a second control signal 112, hereinafter referred to as $V_{mode2}$ 112.

First amplifying transistor 126 and second amplifying transistor 130 form the high-power channel, whereas third amplifying transistor 132 and depletion mode Field Effect Transistor 140 form the low-power channel.

Complementary Reference Voltage Generation Circuit 104 has a first input connected to $V_{ref}$ 106 and a second input connected to $V_{mode1}$ 108. Complementary Reference Voltage Generation Circuit 104 has two output nodes: a first output 105 and a second output 107 for supplying reference voltage to either a high-power channel or a low-power channel. First output 105 provides reference voltage to Low Power Bias Circuit 114 and second output 107 provides reference voltage to both First Stage High Power Bias Circuit 116 and Second Stage High Power Bias Circuit 118.

During operation, Complementary Reference Voltage Generation Circuit 104 generates a pair of high- and low-reference voltage at its two outputs 105 and 107 in response to $V_{mode1}$ 108, enabling either the high-power channel or the low-power channel, for example, when $V_{mode1}$ is at logic low, Complementary Reference Voltage Generation Circuit 104 generates a low-reference voltage level at first output 105 and a high-reference voltage level at second output 107. As a result, Low Power Bias Circuit 114 is turned off, disabling third amplifying transistor 132 and depletion mode Field Effect Transistor 140. At the same time, Complementary Reference Voltage Generation Circuit 104 generates a high-reference voltage at second output 107, and High Power Bias Circuits 116 and 118 are turned on, enabling first and second amplifying transistors 126 and 130.

It should be apparent to one skilled in the art that $V_{mode1}$ 108 may be utilized in another way, i.e., logic zero may be replaced by logic one, and vice versa. Complementary Reference Voltage Generation Circuit 104 is described in detail, in conjunction with FIG. 2.

Bias Current Control Circuit 110 has a first input connected to $V_{mode2}$ 112. In an embodiment of the present invention, Bias Current Control Circuit 110 generates three output signals: a first output signal 113, a second output signal 115 and a third output signal 117. The bias current in Low Power Bias Circuit 114 is controlled by first output signal 113; the bias current in First Stage High Power Bias Circuit 116 is controlled by second output signal 115; and the bias current in Second Stage High Power Bias Circuit 118 is controlled by third output signal 117.

Figure 10:
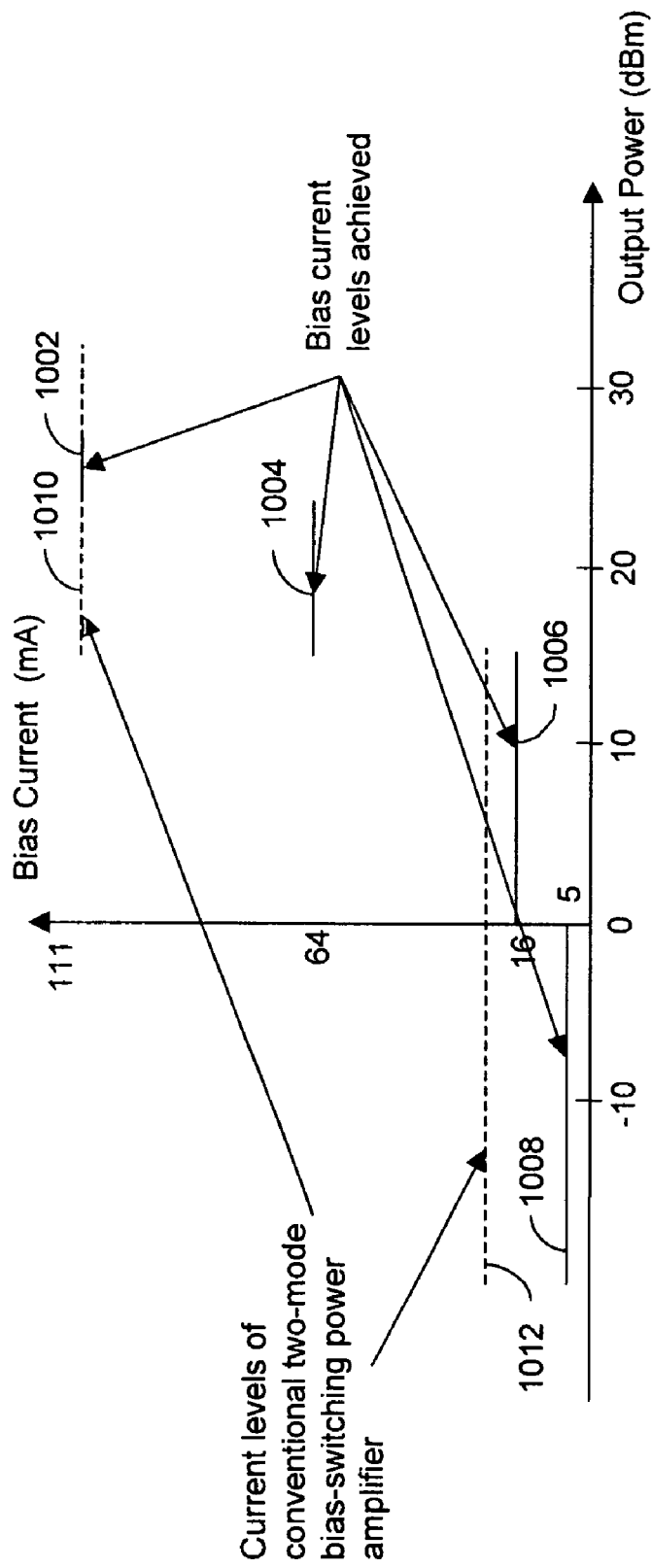
FIG. 10 is a diagram illustrating the bias-current reduction achieved, in accordance with an exemplary embodiment of the present invention.

If power amplifier 102 is operated in high power mode during the operation (i.e., $V_{mode1}$ 108 is at logic low), and $V_{mode2}$ 112 is set at logic low, first and second amplifying transistors 126 and 130 are operated at the high-bias current level, allowing power amplifier 102 to transmit at a high-power level with sufficient linearity, for example, 28 dBm. If power amplifier 102 is operated at the high-power mode (i.e., $V_{mode1}$ 108 is at logic low), and $V_{mode2}$ 112 is set at logic high, the bias currents in the first and second amplifying transistors 126 and 130 are reduced, allowing power amplifier 102 to transmit at a medium-high power level with sufficient linearity, for example, 25 dBm. If power amplifier 102 is operated at low-power mode (i.e., $V_{mode1}$ 108 is at logic high), and $V_{mode2}$ 112 is set at logic low, third amplifying transistor 132 is operated at high-bias current, allowing power amplifier 102 to transmit at a medium-low power level with sufficient linearity, for example, 16 dBm. If power amplifier 102 is operated at the low-power mode (i.e., $V_{mode1}$ 108 is at logic high), and $V_{mode2}$ 112 is set at logic high, the bias current in third amplifying transistor 132 is reduced, allowing power amplifier 102 to transmit at a low-power level, for example, 0 dBm or less. In an embodiment of the present invention, quiescent current is decreased to about 5 mA at 0 dBm or less transmitted power. Bias Current Control Circuit 110 is described in detail, in conjunction with FIG. 3. The logic setting for $V_{mode1}$ 108 and $V_{mode2}$ 112 and their corresponding output power levels is further illustrated in FIG. 9. The absolute bias-current levels of different power levels are shown in FIG. 10.

Figure 2:
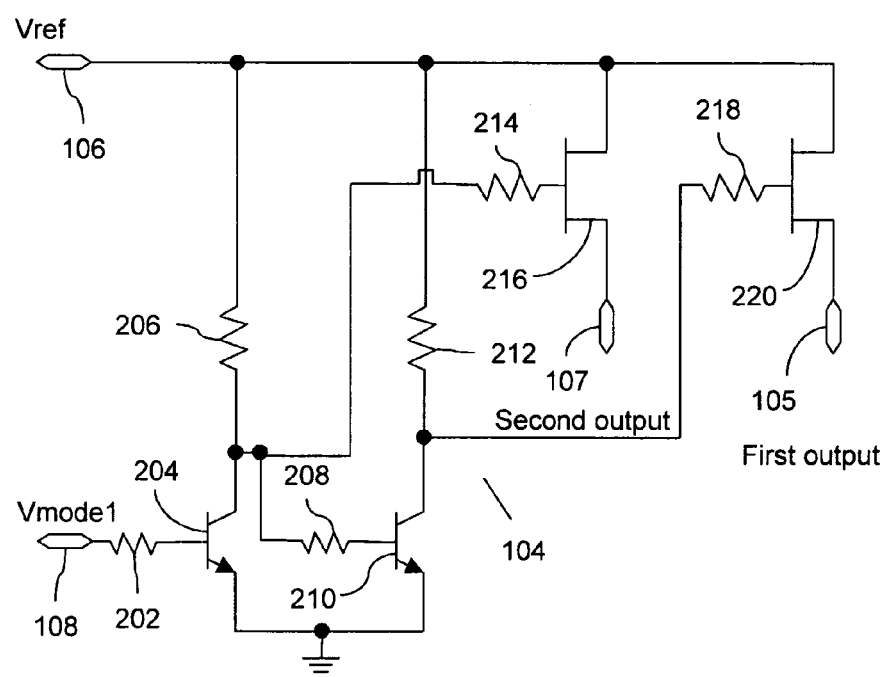
FIG. 2 is a schematic circuit diagram of a Complementary Reference Voltage Generation Circuit, in accordance with an exemplary embodiment of the present invention.

FIG. 2 is a schematic circuit diagram of a complementary reference voltage generation circuit, in accordance with an exemplary embodiment of the present invention. Complementary Reference Voltage Generation Circuit 104 comprises a first resistor 202, a first transistor 204, a second resistor 206, a third resistor 208, a second transistor 210, a fourth resistor 212, a fifth resistor 214, a first depletion mode Field Effect Transistor 216, a sixth resistor 218, and a second depletion mode Field Effect Transistor 220.

Complementary Reference Voltage Circuit 104 is connected to $V_{ref}$ 106 and $V_{mode1}$ 108. First resistor 202 has a first terminal connected to $V_{mode1}$ 108. First transistor 204 has a base connected to a second terminal of first resistor 202, and an emitter connected to the ground. Second resistor 206 has a first terminal connected to a collector of first transistor 204 and a second terminal connected to $V_{ref}$ 106. Third resistor 208 has a first terminal connected to the collector of first transistor 204. Second transistor has a base connected to a second terminal of third resistor 208 and an emitter connected to the ground. Fourth resistor 212 has a first terminal connected to a collector of second transistor 210 and a second terminal connected to $V_{ref}$ 106. Fifth resistor 214 has a first terminal connected to the collector of first transistor 204. First depletion mode Field Effect Transistor 216 has a drain connected to $V_{ref}$ 106, a gate connected to a second terminal of fifth resistor 214, and a source connected to second output 107. Sixth resistor 218 has a first terminal connected to the collector of second transistor 210. Second depletion mode Field Effect Transistor 220 has a drain connected to $V_{ref}$ 106, a gate connected to a second terminal of sixth resistor 218, and a source connected to first output 105.

Figure 3:
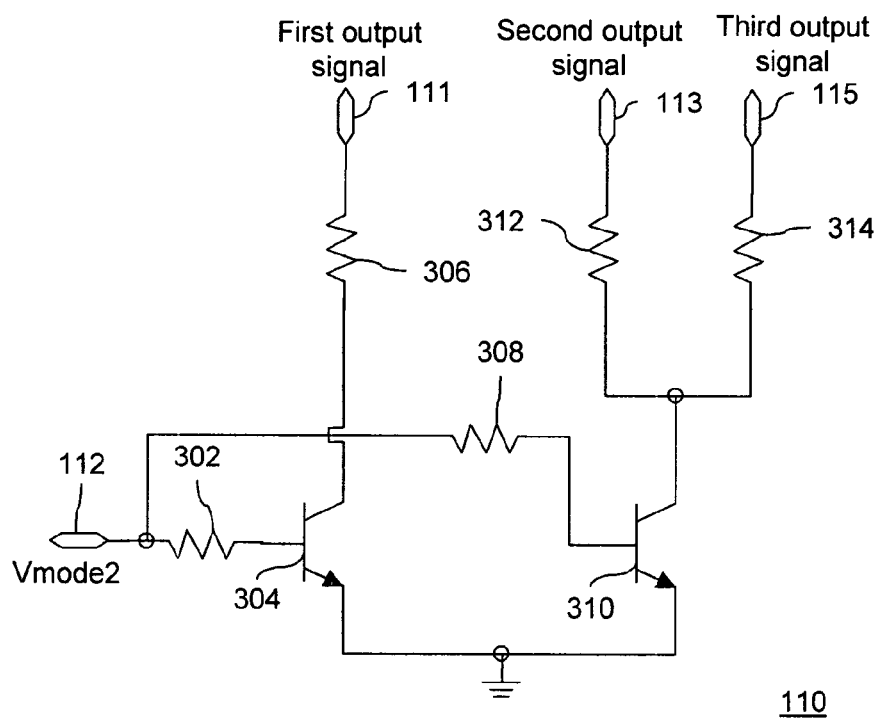
FIG. 3 is a schematic circuit diagram of a Bias Current Control Circuit, in accordance with an exemplary embodiment of the present invention.

FIG. 3 is a schematic circuit diagram of a Bias Current Control Circuit, in accordance with an exemplary embodiment of the present invention. Bias Current Control Circuit 110 comprises a first resistor 302, a first transistor 304, a second resistor 306, a third resistor 308, a second transistor 310, and a fourth resistor 312, and a fifth resistor 314. Bias Current Control Circuit 110 is connected to $V_{mode2}$ 112.

First resistor 302 has a first terminal connected to $V_{mode2}$ 112. First transistor 304 has a base connected to a second terminal of first resistor 302 and an emitter connected to the ground. Second resistor 306 has a first terminal connected to a collector of first transistor 304. First output signal 113 at the second terminal of second resistor 306 controls the bias current in Low Power Bias Circuit 114.

Third resistor 308 has a first terminal connected to $V_{mode2}$ 112. Second transistor 310 has a base connected to a second terminal of third resistor 308 and an emitter connected to the ground. Fourth resistor 312 has a first terminal connected to a collector of second transistor 310 and a second terminal connected to second output signal 115 of Bias Current Control Circuit 110. The bias current in First Stage High Power Bias Circuit 116 is controlled by second output signal 117.

Fifth resistor 314 has a first terminal connected to the collector of second transistor 310 and a second terminal connected to third output signal 117 of Bias Current Control Circuit 110. The bias current in Second Stage High Power Bias Circuit 118 is controlled by third output signal 117.

Low Power Bias Circuit 114, First Stage High Power Bias Circuit 116, and Second Stage High Power Bias Circuit 118 may have a similar structure. These bias circuits generate a suitable bias current for biasing the amplifying transistors that are utilized by power amplifier 102 for amplification of a RF signal from RF input pin 120. A similar bias circuit has been disclosed in U.S. Pat. No. 6,515,546, titled 'Bias Circuit for Use with Low-Voltage Power Supply', assigned to 'Anadigics, Inc.', which is herein incorporated by reference. It should be apparent to one skilled in the art that other bias circuits may also be utilized for biasing, in place of the bias circuit disclosed in U.S. Pat. No. 6,515,546.

Figure 4:
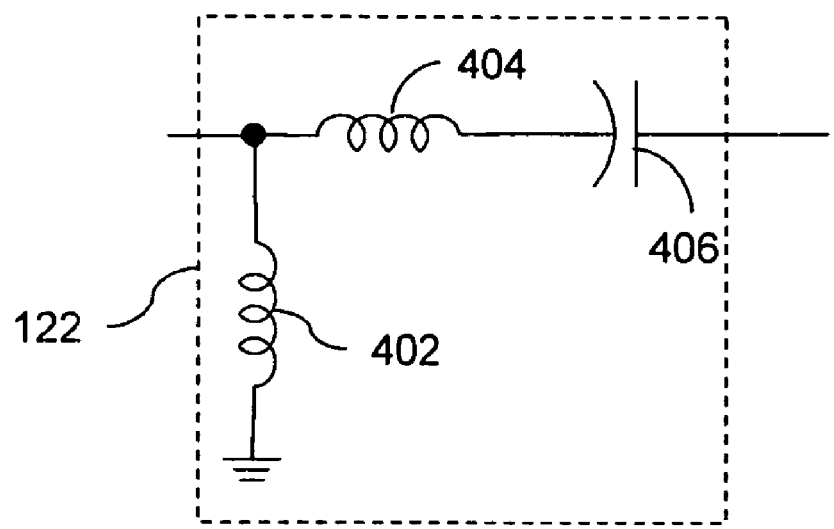
FIG. 4 is a schematic circuit diagram of a High Power Input Matching Circuit, in accordance with an exemplary embodiment of the present invention.

FIG. 4 is a schematic circuit diagram of a High Power Input Impedance Matching Circuit, in accordance with an exemplary embodiment of the present invention. High Power Input Impedance Matching Circuit 122 comprises a first inductor 402, a second inductor 404, and a capacitor 406. First inductor 402 has a first terminal connected to the ground, and a second terminal that acts as the first node of High Power Input Impedance Matching Circuit 122. Second inductor 404 has a first terminal connected to the first node of High Power Input Impedance Matching Circuit 122, and a second terminal connected to a first terminal of capacitor 406. A second terminal of capacitor 406 acts as the second node of High Power Input Impedance Matching Circuit 122.

Figure 5:
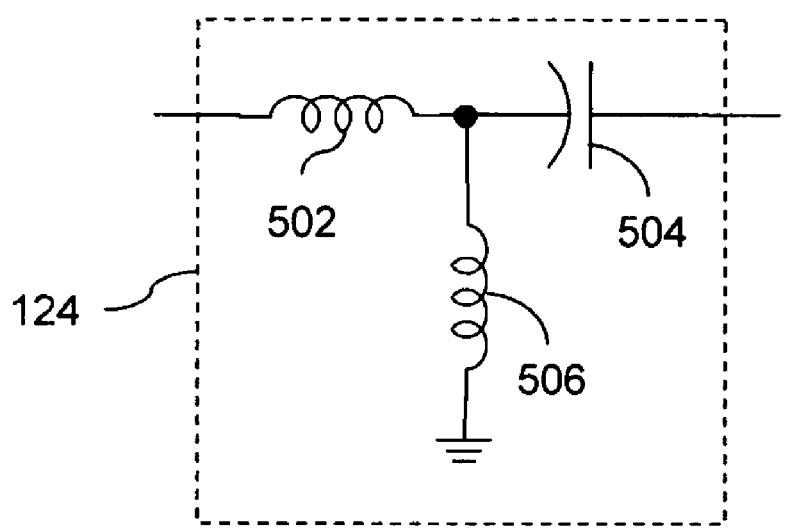
FIG. 5 is a schematic circuit diagram of a Low Power Input Matching Circuit, in accordance with an exemplary embodiment of the present invention.

FIG. 5 is a schematic circuit diagram of a Low Power Input Impedance Matching Circuit, in accordance with an exemplary embodiment of the present invention. Low Power Input Impedance Matching Circuit 124 comprises a first inductor 502, a second inductor 504, and a capacitor 506. First inductor 502 has a first terminal that acts as the first node of Low Power Impedance Matching Circuit 124, and a second terminal connected to a first terminal of second inductor 504. Second inductor 504 has a second terminal connected to the ground. Capacitor 506 has a first terminal connected to the second terminal of first inductor 502, and a second terminal that acts as the second node of Low Power Input Impedance Matching Circuit 124.

Figure 6:
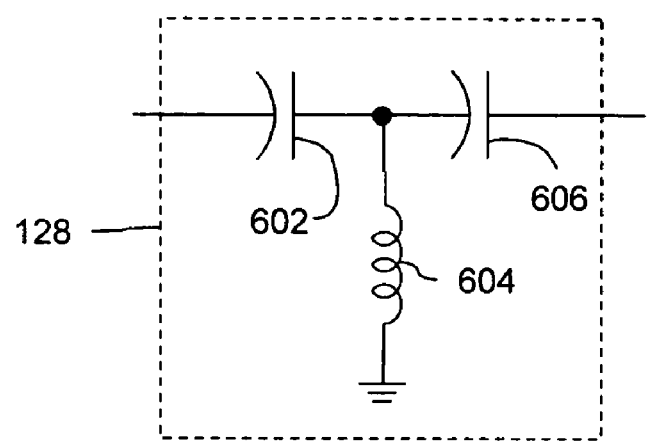
FIG. 6 is a schematic circuit diagram of an Inter-stage Matching Circuit, in accordance with an exemplary embodiment of the present invention.

FIG. 6 is a schematic circuit diagram of an Inter-stage Impedance Matching Circuit, in accordance with an exemplary embodiment of the present invention. Inter-stage Impedance Matching Circuit 128 comprises a first capacitor 602, a first inductor 604, and a second capacitor 606. First capacitor 602 has a first terminal that acts as the first node of Inter-stage Impedance Matching Circuit 128, and a second terminal connected to a first terminal of inductor 604. Inductor 604 has a second terminal connected to the ground. Second capacitor 606 has a first terminal connected to the second terminal of first capacitor 602. The second terminal of first capacitor 602 acts as the second node of Inter-stage Impedance Matching Circuit 128.

Figure 7:
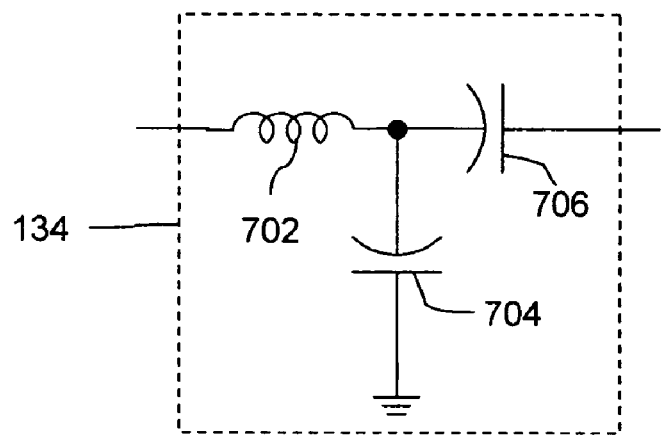
FIG. 7 is a schematic circuit diagram of a High Power Output Matching Circuit, in accordance with an exemplary embodiment of the present invention.

FIG. 7 is a schematic circuit diagram of a High Power Output Impedance Matching Circuit, in accordance with an exemplary embodiment of the present invention. High Power Output Impedance Matching Circuit 134 comprises an inductor 702, a first capacitor 704, and a second capacitor 706. Inductor 702 has a first terminal that acts as the first node of High Power Output Impedance Matching Circuit 134, and a second terminal connected to a first terminal of first capacitor 704. First capacitor 704 has a second terminal connected to the ground. Second capacitor 706 has a first terminal connected to the second terminal of inductor 702, and a second terminal that acts as the second node of High Power Output Impedance Matching Circuit 134.

Figure 8:
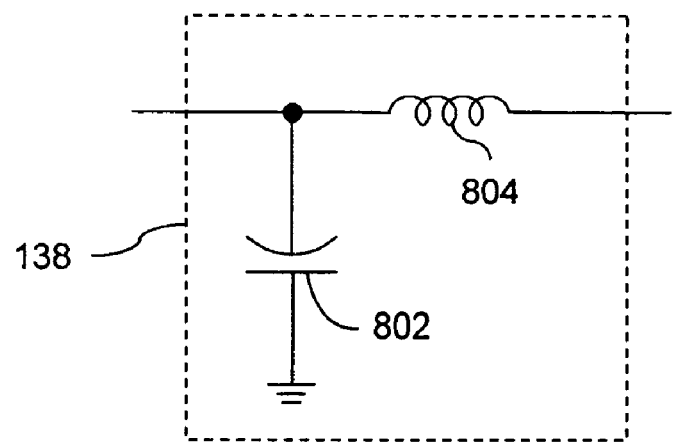
FIG. 8 is a schematic circuit diagram of a Low Power Output Matching Circuit, in accordance with an exemplary embodiment of the present invention.

FIG. 8 is a schematic circuit diagram of a Low Power Output Impedance Matching Circuit, in accordance with an exemplary embodiment of the present invention. Low Power Output Impedance Matching Circuit 138 comprises a capacitor 802, and an inductor 804. Capacitor 802 has a first terminal that acts as the first node of Low Power Output Impedance Matching Circuit 138, and a second terminal connected to the ground. Inductor 804 has a first terminal connected to the first terminal of capacitor 802, and a second terminal that acts as the second node of Low Power Output Impedance Matching Circuit 138.

FIG. 9 is a logic table illustrating the logic levels of various control signals in different output power levels, in accordance with an exemplary embodiment of the present invention. First column of logic table 900 shows $V_{ref}$, $V_{mode1}$, and $V_{mode2}$. $V_{ref}$ is the voltage at $V_{ref}$ 106, $V_{mode1}$ is the logic level at $V_{mode1}$ 108, and $V_{mode2}$ is the logic level at $V_{mode2}$ 112. Logic table 900 illustrates four output power levels. These output power levels may be 28 dBm, 25 dBm, 16 dBm, and 0 dBm. As shown in FIG. 9, 28 dBm and 25 dBm are the two output power levels in the high-power mode, while 16 dBm and 0 dBm are the two output power levels in the low-power mode. Logic table 900 also shows the logic levels of $V_{ref}$, $V_{mode1}$, and $V_{mode2}$ when the power amplifier is shutdown, i.e., $V_{ref}$ is low, $V_{mode1}$ is low, and $V_{mode2}$ is low when the power amplifier is shut down.

Logic table 900 shows the logic levels of various control signals for different output power levels, for example, in the 28 dBm output power level, $V_{ref}$ is high, $V_{mode1}$ is low, and $V_{mode2}$ is low. In the 25 dBm output power level, $V_{ref}$ is high, $V_{mode1}$ is low, and $V_{mode2}$ is high. In the 16 dBm output power level, $V_{ref}$ is high, $V_{mode1}$ is high, and $V_{mode2}$ is low. Similarly, in the 0 dBm output power level, $V_{ref}$ is high, $V_{mode1}$ is high, and $V_{mode2}$ is high. The selection of suitable logic levels for the control signals and reference voltages enables the generation of a suitable output power level.

It should be apparent to one skilled in the art that the logic configuration may be implemented in another way, i.e., logic low may be replaced by logic high, and vice versa.

FIG. 10 is a diagram illustrating the bias current reduction achieved, in accordance with an exemplary embodiment of the present invention. FIG. 10 also shows the bias current levels achieved by a conventional two-mode bias-switching power amplifier, as well as the bias current levels achieved in an embodiment of the present invention. In FIG. 10, the X-axis represents the output power level and the Y-axis represents the bias current levels. Bias current levels achieved in an embodiment of the present invention are bias current levels 1002, 1004, 1006, and 1008, while the bias current levels achieved by the conventional two-mode bias-switching power amplifier are bias current levels 1010 and 1012. The bias current levels achieved in an embodiment of the present invention in the high-power mode are levels 1002 and 1004. Whereas the bias current levels achieved in the low-power mode are levels 1006 and 1008. Level 1002 is the bias current level when power amplifier 102 transmits a high power level, for example, 28 dBm. Level 1004 is the bias current level when power amplifier 102 transmits a medium-high power level, for example, 25 dBm. Similarly, level 1006 is the bias current level when power amplifier 102 transmits a medium-low power level, for example, 16 dBm. Level 1008 is the bias current level when power amplifier 102 transmits a low-power level, for example, 0 dBm. Bias current level 1002 is equal to bias current level 1010, while bias current level 1004 is lower than bias current level 1010. Similarly, bias current levels 1006 and 1008 in the low-power mode of the present invention are lower than bias current level 1012 of conventional two-mode bias-switching power amplifiers in the low-power mode. In an embodiment of the present invention, a reduction in bias current levels is achieved, which is not possible with conventional two-mode power amplifiers. In an exemplary embodiment of the present invention, the lowest attainable bias current is about four to five times less than that achieved by conventional two-mode power amplifiers. This significantly reduces the amount of DC power required to operate power amplifier 102 at low-power levels, especially 0 dBm or less, thereby enhancing the battery life of a wireless communication device by utilizing the power amplifier.

Figure 11:
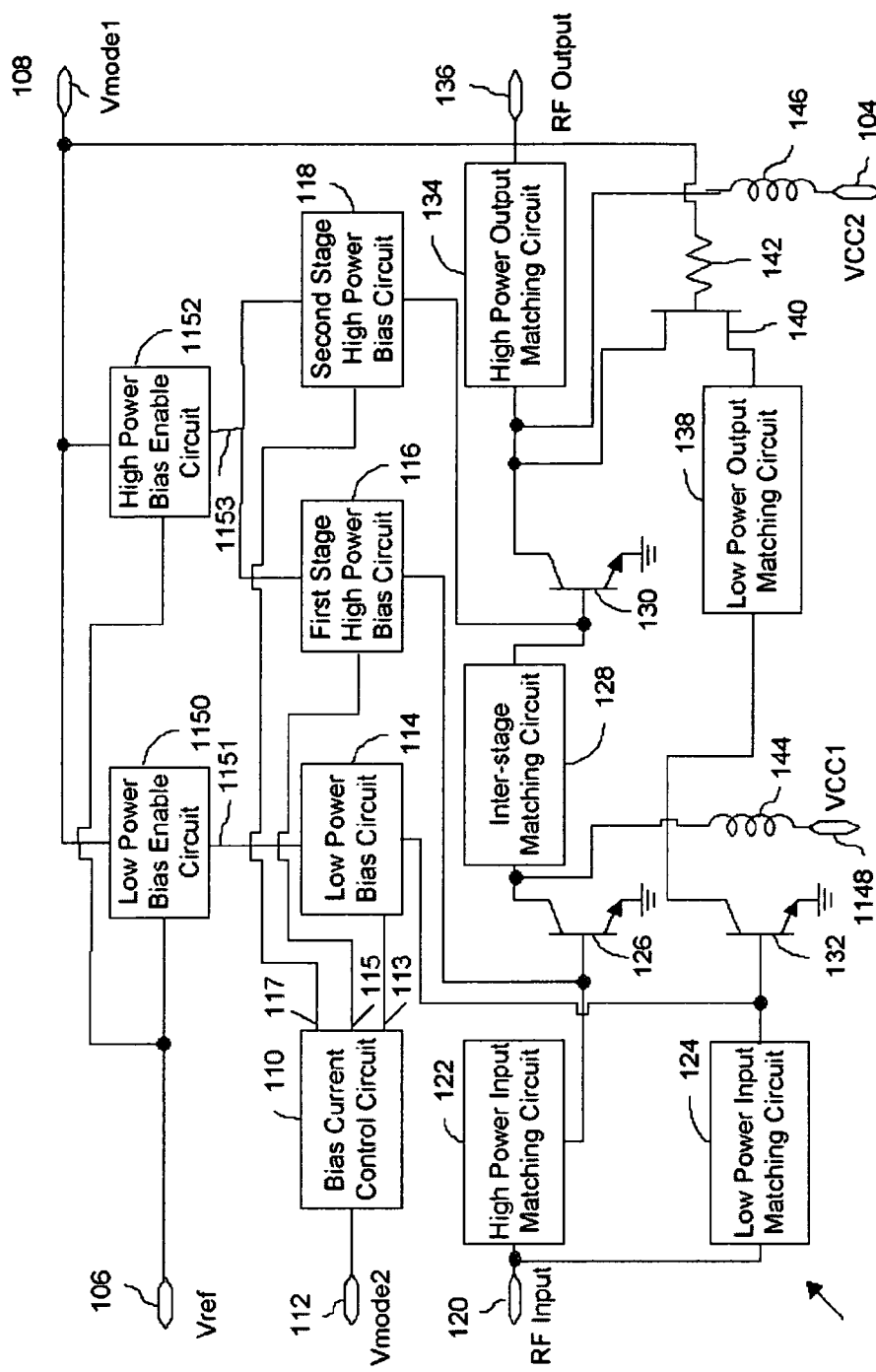
FIG. 11 is a block diagram illustrating a power amplifier and its bias control circuit, in accordance with another exemplary embodiment of the present invention.

FIG. 11 is a block diagram illustrating a power amplifier and its bias control circuit, in accordance with another exemplary embodiment of the present invention, with the same reference numbers as in FIG. 1 used to identify similar components. Power amplifier 1102 is similar to power amplifier 102 except that Complementary Reference Voltage Generation Circuit 104 of power amplifier 102 is replaced in power amplifier 1102 with a Low Power Bias Enable Circuit 1150 and a High Power Bias Enable Circuit 1152. An output 1151 of Low Power Bias Enable Circuit 1150 enables or disables Low Power Bias Circuit 114 whereas an output 1153 of High Power Bias Enable Circuit 1152 enables or disables First Stage High Power Bias Circuit 116 and Second Stage High Power Bias Circuit 118. Control signal $V_{mode1}$ 108 controls both Low Power Bias Enable Circuit 1150 and High Power Bias Enable Circuit 1152. When First and Second Stage High Power Bias Circuits 116 and 118 are enabled, Low Power Bias Circuit 114 is disabled and vice versa. Low Power Bias Enable Circuit 1150 also controls an amplifying transistor 132 in a low power channel. Similarly, High Power Bias Enable Circuit 1152 also controls amplifying transistors 126 and 130 in a high power channel. In an embodiment of the present invention, the Low Power Bias Enable Circuit 1150 includes a standard DC switch and Low Power Bias Circuit 114. Similarly, High Power Bias Enable Circuit 1152 includes a standard DC switch and High Power Bias Circuit 116 or 118.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A power amplifier including multi-mode digital bias control circuitry, the power amplifier generating four different bias current levels in response to a combination of two control signals, the power amplifier comprising:

a. a complementary reference voltage generation circuit having a first input connected to a first reference voltage, and a second input connected to the first control signal;

b. a bias current control circuit having an input connected to the second control signal;

c. a low power bias circuit having a first input connected to a first output of the complementary reference voltage generation circuit, and a second input connected to a first output of the bias current control circuit;

d. a first stage high power bias circuit having a first input connected to a second output of the complementary voltage reference generation circuit, and a second input connected to a second output of the bias current control circuit; and e. a second stage high power bias circuit having a first input connected to the second output of the complementary voltage reference generation circuit, and a second input connected to a third output of the bias current control circuit.

2. The power amplifier of claim 1, wherein the complementary reference voltage generation circuit has two outputs, enabling or disabling bias circuits of low power channel and high power channel:

a. a first output connected to the low power bias circuit; and b. a second output connected to the first stage high power bias circuit and the second stage high power bias circuit.

3. The power amplifier of claim 1, wherein the multi-mode digital bias control circuitry sets a bias current for the power amplifier transmitting at a high-power level with sufficient linearity, when the first control signal is at logic low and the second control signal is set at logic low.

4. The power amplifier of claim 1, wherein the multi-mode digital bias control circuitry sets a bias current for the power amplifier transmitting at a medium high-power level with sufficient linearity, when the first control signal is at logic low and the second control signal is set at logic high.

5. The power amplifier of claim 1, wherein the multi-mode digital bias control circuitry sets a bias current for the power amplifier transmitting at a medium-low power level with sufficient linearity, when the first control signal is at logic high and the second control signal is set at logic low.

6. The power amplifier of claim 1, wherein the multi-mode digital bias control circuitry sets a bias current for the power amplifier transmitting at a low power level with sufficient linearity, when the first control signal is at logic high and the second control signal is set at logic high.

7. The power amplifier of claim 2, wherein the complementary reference voltage generation circuit shuts down both the high power channel and the low power channel when external reference voltage is at logic low.

8. The power amplifier of claim 1, wherein the bias current control circuit controls bias currents in:

a. the low power bias circuit;

b. the first stage high power bias circuit; and c. the second stage high power bias circuit.

9. The power amplifier of claim 1, wherein the complementary reference voltage generation circuit generates a pair of high and low voltages when an external reference voltage is on, enabling or disabling the high power channel or low power channel, the complementary reference voltage generation circuit comprising:

a. a first resistor having a first terminal connected to the first control signal;

b. a first transistor having a base connected to a second terminal of the first resistor, and an emitter connected to ground;

c. a second resistor having a first terminal connected to a collector of the first transistor, and a second terminal connected to the first reference voltage;

d. a third resistor having a first terminal connected to the collector of the first transistor;

e. a second transistor having a base connected to a second terminal of the third resistor, and an emitter connected to the ground;

f. a fourth resistor having a first terminal connected to the first reference voltage and a second terminal connected to a collector of the second transistor;

g. a fifth resistor having a first terminal connected to the collector of the first transistor;

h. a first field effect transistor having a gate connected to a second terminal of the fifth resistor, a drain connected to the first reference voltage, and a source connected to the low power bias circuit;

i. a sixth resistor having a first terminal connected to the collector of the second transistor; and j. a second field effect transistor having a gate connected to a second terminal of the sixth resistor, a drain connected to the first reference voltage, and a source connected to both the first stage high power bias circuit and the second stage high power bias circuit.

10. The power amplifier of claim 1, wherein the bias current control circuit enables control of bias current in the low power bias circuit, the first stage high power bias circuit and the second stage high power bias circuit, the bias current control circuit comprising a. a first resistor having a first terminal connected to the second control signal;

b. a first transistor having a base connected to a second terminal of the first resistor, and an emitter connected to the ground;

c. a second resistor having a first terminal connected to a collector of the first transistor, and a second terminal, wherein bias current in low power bias circuit is controlled by an output signal at the second terminal;

d. a third resistor having a first terminal connected to the second control signal;

e. a second transistor having a base connected to a second terminal of the third resistor, and an emitter connected to the ground;

f. a fourth resistor having a first terminal connected to a collector of the second transistor, and a second terminal, wherein bias current in the first stage high power bias circuit is controlled by an output signal at the second terminal; and g. a fifth resistor having a first terminal connected to a collector of the second transistor, and a second terminal, wherein bias current in the second stage high power bias circuit is controlled by an output signal at the second terminal.

11. A power amplifier including multi-mode digital bias control circuitry, the power amplifier capable of generating four different bias current levels in response to a combination of two control signals, the power amplifier comprising:

a. a low power bias enable circuit, the low power bias enable circuit having a first input connected to a first reference voltage, and a second input connected to the first control signal;

b. a high power bias enable circuit, the high power bias enable circuit having a first input connected to the first reference voltage, and a second input connected to the first control signal controls the first stage high power bias circuit and the second stage high power bias circuit;

c. a bias current control circuit having an input connected to the second control signal;
d. a low power bias circuit having a first input connected to output of the low power bias enable circuit, and a second input connected to a first output of the bias current control circuit;
e. a first stage high power bias circuit having a first input connected to a first output of the high power bias enable circuit, and a second input connected to a second output of the bias current control circuit; and
f. a second stage high power bias circuit having a first input connected to a second output of the high power bias enable circuit, and a second input connected to a third output of the bias current control circuit.

12. The power amplifier bias control circuitry of claim 11, wherein the low power bias enable circuit further controls at least one amplifying transistor in a low power channel.

13. The power amplifier bias control circuitry of claim 11, wherein the high power bias enable circuit further controls at least one amplifying transistor in a high power channel.

14. A power amplifier circuit having a first input node connected to a first reference voltage, a second input node connected to a ground, a first control input node connected to a first control signal, and a second control input node connected to a second control signal, the power amplifier circuit comprising:
   a. a complementary reference voltage generation circuit having a first input connected to a first reference voltage, and a second input connected to the first control signal;
   b. a bias current control circuit having an input connected to the first control signal;
   c. a low power bias circuit having a first input connected to a first output of the complementary reference voltage generation circuit, and a second input connected to a first output of the bias current control circuit;
   d. a first stage high power bias circuit having a first input connected to a second output of the complementary voltage reference generation circuit, and a second input connected to a second output of the bias current control circuit;
   e. a second stage high power bias circuit having a first input connected to the second output of the complementary voltage reference generation circuit, and a second input connected to a third output of the bias current control circuit;
   f. a high power input impedance matching circuit having a first node connected to an input signal and a second node connected to an output node of the first stage high power bias circuit, the high power input impedance matching circuit matching impedance between the input signal and an output signal of the first stage high power bias circuit;
   g. a low power input impedance matching circuit having a first node connected to an input signal and a second node connected to an output node of the low power bias circuit, the low power input impedance matching circuit matching impedance between the input signal and an output signal of the low power bias circuit;
   h. a first transistor having a base connected to the output of the first stage high power bias circuit, and an emitter connected to the ground;
   i. an inter-stage impedance matching circuit having a first node connected to a collector of the first transistor and a second node connected to an output of the second stage high power bias circuit, the inter-stage impedance matching circuit matching impedance between a signal at the collector of the first transistor and an output signal of the second stage high power bias circuit;
   j. a second transistor having a base connected to the output of the second stage high power bias circuit, and an emitter connected to the ground;
   k. a third transistor having a base connected to the output of the low power bias circuit, an emitter connected to the ground;
   i. a high power output impedance matching circuit having a first node connected to a collector of the second transistor and a second node connected to an output node, the high power output impedance matching circuit matching impedance between a signal at the collector of the second transistor and an output signal of the power amplifier circuit;
   m. a field effect transistor having source connected to the collector of the second transistor;
   n. a low power output impedance matching circuit having a first node connected to a collector of the third transistor and a second node connected to a drain of the field effect transistor; and
   o. a resistor having a first terminal connected to the gate of the field effect transistor, and a second terminal connected to the second input of the complementary reference voltage generation circuit.

* * * * *